United States Patent [19]

Smisko

[11] Patent Number: 4,902,886
[45] Date of Patent: Feb. 20, 1990

[54] NOISE REDUCTION FOR PHOTODIODE ARRAYS

[75] Inventor: J. Daniel Smisko, Newark, Del.

[73] Assignee: Hewlett-Packard Company, Palo Alto, Calif.

[21] Appl. No.: 299,382

[22] Filed: Jan. 23, 1989

[51] Int. Cl.⁴ ............................................. H01J 40/14
[52] U.S. Cl. .................................. 250/214 R; 250/578
[58] Field of Search ............ 250/214 R, 214 A, 214 C,
250/578; 307/311; 358/213.15, 213.18, 213.27,
213.28, 213.16

[56] References Cited

U.S. PATENT DOCUMENTS

| | | | |
|---|---|---|---|
| 4,145,721 | 3/1979 | Beaudouin et al. | 250/578 |
| 4,567,363 | 1/1986 | Goodnough | 250/214 A |
| 4,600,843 | 7/1986 | Kizu et al. | 250/578 |
| 4,652,767 | 3/1987 | Tajiri et al. | 250/578 |
| 4,680,477 | 7/1987 | Sato et al. | 250/578 |
| 4,749,852 | 6/1988 | Takahashi | 250/578 |
| 4,791,286 | 12/1988 | Wall | 250/214 A |
| 4,797,546 | 1/1989 | Berger et al. | 250/214 R |
| 4,797,561 | 1/1989 | Tajiri et al. | 250/578 |

Primary Examiner—David C. Nelms
Assistant Examiner—Michael Messinger
Attorney, Agent, or Firm—Richard F. Schuette

[57] ABSTRACT

A method and apparatus for reducing noise in a light sensing circuit having a photodiode array coupled to a charge amplifier through a field effect transistor transfer switch. Thermal noise generated by the transfer switch is combined with image signals inputted to the charge amplifier resulting in an outputted noisy image signal. The invention eliminates this noise by taking two consecutive readings of the charge amplifier output, one before and one after closing the transfer switch and after opening it. The thermal noise generated by the transfer switch, and added to the next reading of the charge amplifier output, is equal to the difference between these two readings. Once stored, this difference can be subtracted from the previously mentioned "next reading", resulting in the elimination of this noise term.

7 Claims, 5 Drawing Sheets

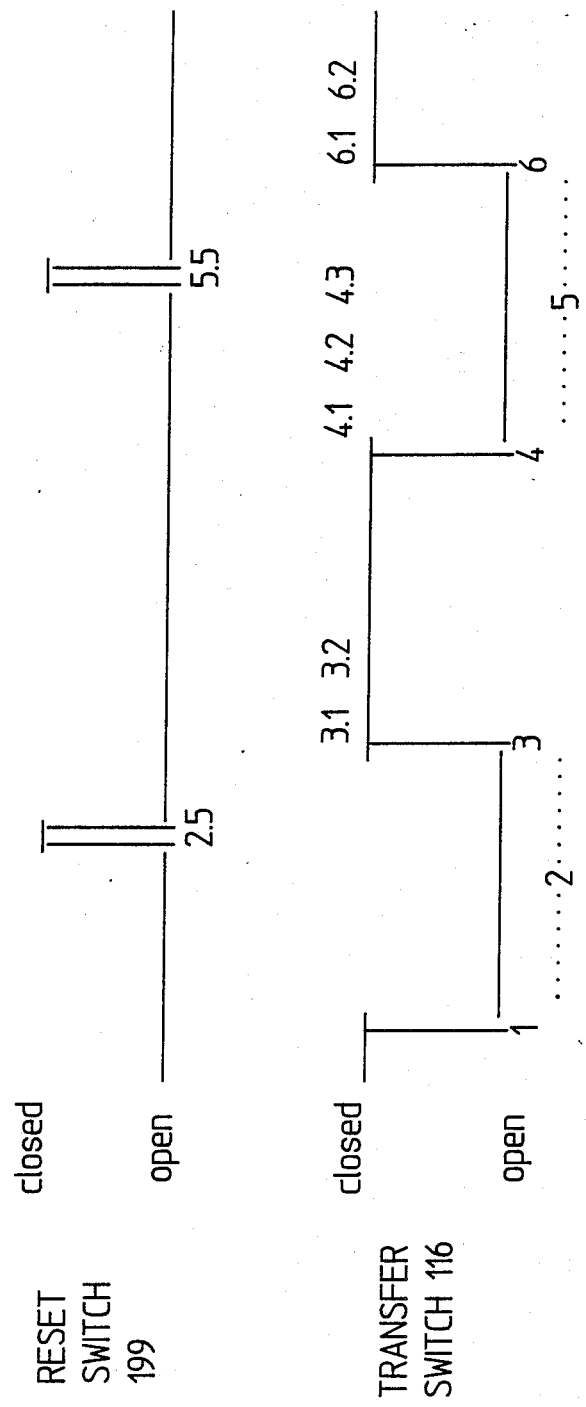

NOISE REDUCTION FOR PHOTODIODE ARRAYS

BACKGROUND OF INVENTION

This invention relates generally to reducing noise in Photodiode Arrays (PDA), and in the preferred embodiment, to improving the performance of a spectrometer which uses a photodiode array detector. In such a spectrometer, light of different wavelengths is focused on different elements, or pixels, of the PDA. Each pixel consists of a photodiode and an associated storage capacitor which may be the junction capacitance of the photodiode or a physical capacitor incorporated into the PDA. The capacitor is charged to a reference voltage and then partially discharged as the photodiode conducts photo current in response to the light signal. A number of Field Effect Transistor (FET) transfer switches are coupled in series between each pixel and a charge amplifier. Each pixel may be read out in succession by sequentially turning on, therefore, closing, the associated transfer switch. This action also enables the amplifier to recharge the associated capacitor to the reference voltage. The amount of charge required to bring the capacitors up to the reference voltage is defined as the image signal charge and is proportional to the intensity of the light or image incident on the photodiode.

Sensitivity, a measurement of the minimum amount of the image signal or light signal that can be detected, is an important feature of spectrometers used in atomic emission detectors. To monitor the signal of interest, a PDA is used to convert optical emissions into an electronic signal. During operation, electronic noise generated by the PDA can obscure weak signals. The invention reduces this noise, and thereby improves the overall sensitivity of the spectrometer or other apparatus employing the invention.

FIG. 1 shows a conventional PDA 5 connected to a charge amplifier 20. One side of each photodiode capacitor pair is coupled to a common node 6. Serial readout of a charge voltage across each photodiode 13 in the PDA 5 is accomplished by means of a digital shift register (not shown) coupled to the transfer switches 16 ($Q_1$-$Q_n$). Operation of this circuit is as follows:

1. After the previous readout cycle is completed, each pixel capacitor 14 ($C_1$-$C_n$) is charged to a reference voltage $V_d$. Such charging is carried out by the action of the operational amplifier 23 as the reference voltage is maintained between its non-inverting input and the common node of the photodiode array.

2. After the pixel capacitors 14 have been charged, the transfer switch 16 is opened, so that the photodiode 13 and pixel capacitor 14 are disconnected from the operational amplifier 23 for a specified period of time. An optical or light signal 8 is converted to an image signal by the associated photodiode and is integrated on pixel capacitors $C_1 \ldots C_n$, thus discharging each capacitor by an amount of charge representative of the intensity of the optical or light signal 8. The amount of charge removed is defined as the "image signal charge". The term "image signal" is not meant to limit the meaning of "signal" to something corresponding to optical signals which are pictorial in nature. Rather, "image signal" denotes a signal which is a representation of, and is generally proportional to, the intensity of the light of the corresponding optical signal. This optical signal can be either pictorial, as in a camera, or spectral, as in a spectrometer, or of a different nature. The amount of charge removed is defined as the "image signal charge".

3. Transfer switches 16 ($Q_1$-$Q_n$) are employed for successively recharging capacitors 14 ($C_1$-$C_n$) by transferring the image signal charge to the inverting input node 99 of the operational amplifier. The operational amplifier acts to keep the voltage on the inverting input node 99 equal to the voltage on the non-inverting input, by changing the voltage on the output node 97 until the input node 99 equals the voltage on the non-inverting input. In this circuit, the non-inverting input, and therefore the inverting input, are equal to ground. Thus, the inverting input is commonly referred to as virtual ground. At this point, all of the of the image signal charge is held on the feedback capacitor 22 ($C_f$), and none of it is stored on capacitor 24 ($C_a$), and the voltage at the output node 97 is proportional to the image signal charge. Each pixel may be successively read in this fashion. After reading each pixel, field effect transistor reset switch 21 ($Q_f$) is closed to short out capacitor 22 ($C_f$), then opened to accept the charge from the next pixel.

4. Other circuitry (not shown) reads the value of the image charge signal and stores each reading in a computer memory for processing.

During the reset operation of the operational amplifier (step 3), the closed loop bandwidth of the integrator amplifier 23 is increased significantly. This results in increased noise charge fluctuations at the inverting input node 99. These fluctuations are due to the input voltage noise of the amplifier as well as thermal noise generated by the reset switch 21. At the instant the reset switch is opened, whatever noise voltage happens to be present on the inverting input node 99 is "frozen" on capacitor 22 ($C_f$).

One prior art technique for reducing this noise is called "correlated double sampling" and employs the analog subtraction circuit 25 shown in FIG. 2 and incorporated into FIG. 1. This circuit consists of a series capacitor 26 and a switch 27 that connects the output end of the capacitor to ground. Switch 27 is turned on just after the integrator amplifier 23 reset operation, and turned off just before the next pixel is connected to the integrator amplifier 23 input. This causes the sum of the amplifier input noise and the thermal noise charges to be stored on capacitor 26, thereby subtracting this term from the output signal. As illustrated in FIG. 1, this circuit is coupled to the output of the charge amplifier 20. However, such an analog subtract circuit is not required for the detection of light signals in a photodiode array, but it does enhance performance.

The FET transfer switch 16 ($Q_1$) is another source of thermal noise. This noise is sometimes even greater than the reset switch noise. Unfortunately, the correlated double sampling subtraction technique does not address this problem and overall sensitivity of any device employing the PDA is impaired.

In particular, the switching action of the field effect transistor transfer switch in the integration-readout process causes a noise term, called "kTC" noise, to be unfortunately added to each photodiode measurement. This "kTC" noise is a type of thermal noise which is caused by random motion of electrons in some electronic devices, and Field Effect Transistors in particular, and is associated with resetting the photodiode capacitance to a fixed voltage. The term kTC stems from Boltzman's constant "k", the temperature "T" and the capacitance "C". In actuality, this thermal noise charge corresponds to the square root of k*T*C which is technically defined as the Root Mean Square (RMS) noise charge. However, this noise charge will hereinafter be identified as "kTC noise". When PDA's are operated at low light levels, this kTC noise is often the largest noise term. It is the purpose of this invention to eliminate this kTC noise.

SUMMARY OF THE INVENTION

Accordingly, it is the object of the present invention to provide an improved method and apparatus for reducing signal noise in a PDA. By reducing this noise, smaller optical signals can be detected, thereby increasing the overall sensitivity of most types of apparatus which employ a PDA. A preferred embodiment of the present invention employs a microprocessor, coupled to a PDA and a low bandwidth charge amplifier, to control the switching of the PDA, which is coupled, through a FET transfer switch to the charge amplifier such that image signal charges and noise charges can be measured and stored for processing. In particular, the invention measures and stores kTC noise charges generated by the transfer switch. By taking two readings for each photodiode in the array, it is possible to isolate the kTC noise charge so that it can be subtracted from the image signal charge containing this noise term to obtain a true output image signal. In this disclosure, image signal denotes a signal which is a representation of, and is generally proportional to, the intensity of the light of the corresponding, optical signal. As noted before, this optical signal can be pictorial, as in a camera, spectral, as in a spectrometer or of a different nature.

The invention is the product of three discoveries which together provide for substantial noise reduction. The first discovery was the inventor's realization that the kTC noise charge generated by the transfer switch displaces itself evenly, but with opposite polarity, on the photodiode capacitor and the charge amplifier when the transfer switch is opened. Secondly, the inventor discovered a subtraction technique in which an error signal could be isolated and stored for later subtraction from an image charge signal also containing the unwanted noise, thus providing the desired error-free image charge signal. And thirdly, the inventor discovered that by using a low bandwidth amplifier, which does not respond to high frequency noise, it would be possible to take two image charge signal readings for each photodiode during each cycle of the PDA. The first reading includes both a first noise charge signal and an image charge signal, and the second reading includes both the first reading and a second noise charge signal. The first reading is made with the transfer switch is closed, and the second reading is made after the transfer switch is subsequently opened. During the first reading, the amplifier does not respond to the second noise charge signal as it is a high frequency AC signal while the switch is closed. Once the transfer switch is opened, this signal stops changing rapidly and the second reading is made. Therefore, the function of the low bandwidth amplifier is not only to reduce noise at the output, but is also used to enable the charge amplifier to respond to the noise signals so that they can be amplified, measured and subtracted.

These discoveries are all interrelated. In particular, the even distribution of the kTC noise charge provides for two measurements of this noise charge. However, it is through the use of the low bandwidth amplifier that the noise charge can be effectively distinguished and measured in the presence of an image signal.

In particular, the invention reduces noise in one light sensing circuit, which includes at least a parallel combination of a photodiode and a photodiode capacitor as a pair, or the equivalent thereto, coupled to a low bandwidth charge amplifier through a transfer switch. A series of noisy image signals, corresponding to an image signal representing the intensity of light incident on the photodiode and an unwanted noise signal, generated by the transfer switch, may be sequentially transferred to the charge amplifier by opening and closing the transfer switch. Such transferred signals may be measured and stored for further processing to eliminate the unwanted noise. Noise reduction may be accomplished by the following steps;

(1) measuring the charge amplifier output, a first time after closing the transfer switch and a second time after opening the transfer switch, the unwanted noise signal being displaced evenly, but of opposite polarity, on both sides of the open transfer switch, (2) subtracting said first and second measurements, wherein the difference corresponds to said unwanted noise signal;

(3) storing the difference;

(4) resetting the charge amplifier to accept a new signal;

(5) transferring the noisy image signal next in the series of noisy image signals, and which contains the displaced unwanted noise signal of opposite polarity, to the charge amplifier;

(6) measuring the charge amplifier output;

(7) adding the stored difference to the transferred noisy image signal to eliminate the unwanted noise signal.

BRIEF DESCRIPTION OF THE DRAWINGS

FIG. 5 is a transfer switch and reset switch timing diagram illustrating signal charge values during the operation of the invention.

DESCRIPTION OF THE PREFERRED EMBODIMENT

Figure 3:
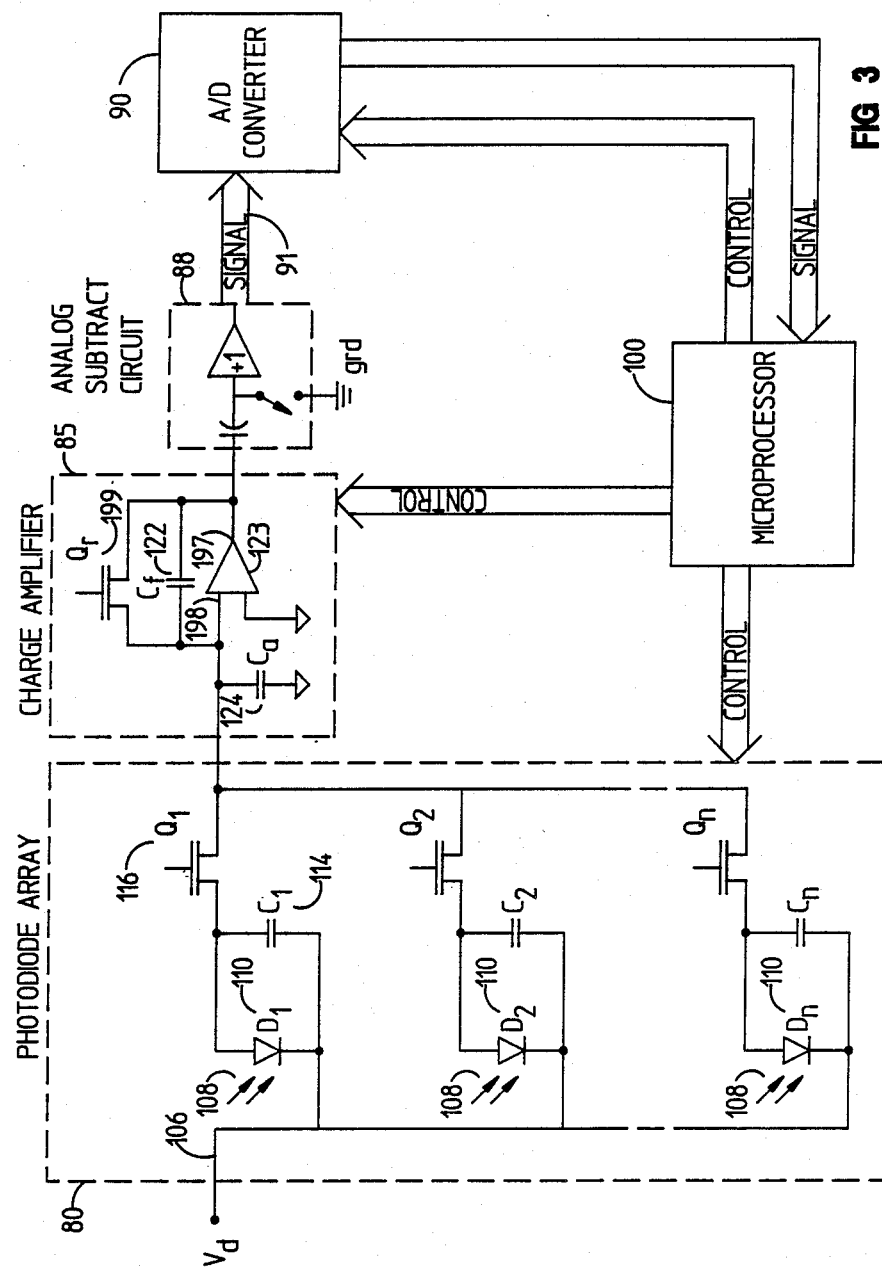
FIG. 3 is a schematic diagram of the invention.

The present invention is disclosed in FIG. 3 and is utilized, in the preferred embodiment, in the input section for a spectrometer. In particular, incident light 108 is translated into an electronic measure readable by the microprocessor 100. The PDA 80 and the charge amplifier 85 operate in a manner similar to that disclosed in the Background of the Invention and illustrated in FIG. 1. A series of transfer switches 116 ($Q_1$-$Q_n$) are employed for coupling each pixel of the PDA 80 to the charge amplifier 85. One side of each photodiode capacitor pair in the PDA 80 is coupled to a common node 106. A reference voltage $V_d$ is also coupled to the circuit at this common node 106. Depending on the type of sensor in which the invention is employed, the reference voltage of the PDA may vary.

Figure 1:
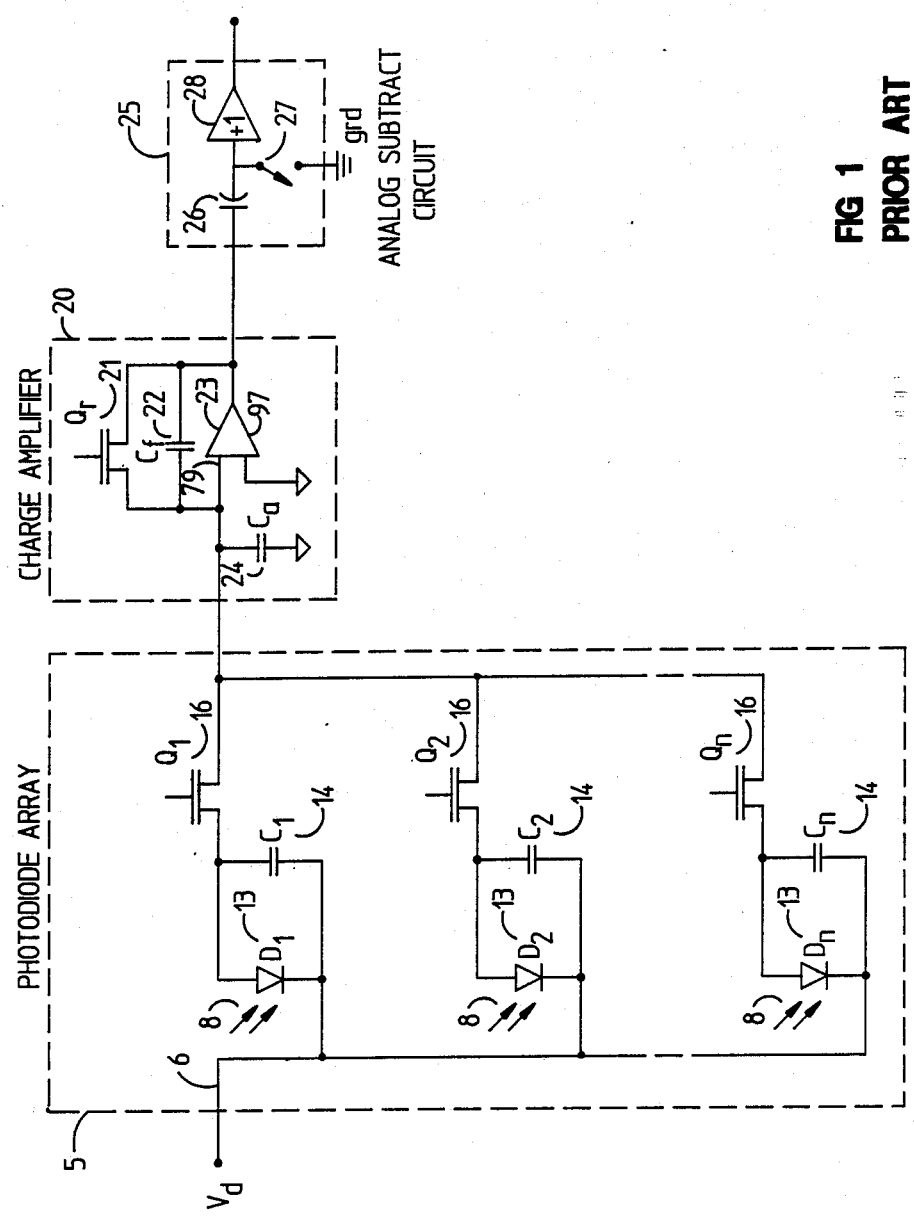
FIG. 1 is a schematic diagram of a known photodiode array coupled to a charge amplifier circuit.

Unlike the prior device illustrated in FIG. 1, the invention employs a charge amplifier 85 having a very low bandwidth operational amplifier 123 to limit kTC noise associated with a closed transfer switch 116 while the image charge on the photodiode capacitor 114 is being measured, as well as being able to respond to the kTC noise associated with an opened transfer switch 116 while the noise charge is being measured. With the switch opened, the kTC noise charge appears as a slowly varying signal, something a low bandwidth amplifier can respond to, as opposed to a rapidly fluctuating AC signal. The bandwidth of the amplifier is made sufficiently low such that the time constant of the amplifier is much greater than the time constant $RC_s$, where $C_s$ is the series combination of the photodiode capacitor $C_1$ and the total amplifier capacitance $C_t$ which consists of the amplifier input capacitance and the capacitance of the feedback capacitor 122. The use of a low bandwidth amplifier provides for making two readings of each photodiode during each cycle of the PDA, and noise reduction through an inventive subtraction technique. In the preferred embodiment, an operational amplifier having a time constant of approximately 10 microseconds and a 3 dB point of 16 kilohertz was utilized. This time constant is more than five times greater than the product of the transfer switch resistance and the series combination of the total amplifier capacitance and the photodiode capacitance. Additionally, the amplifier time constant is less than one-fifth of the readout time for each photodiode element of the photodiode array.

The advantages of this invention stem from the recognition that the kTC noise charge generated by the transfer switch 116 ($Q_1$) is displaced, upon opening of the transfer switch 116 ($Q_1$), evenly (but with opposite polarity) upon the photodiode capacitor 114 ($C_1$-$C_n$) and upon the parallel combination of the feedback capacitor 122 ($C_f$) and the equivalent capacitor 124 ($C_a$) which represents the input capacitance of the charge amplifier 85 as well as the run capacitance of the PC board. This charge distribution, not previously appreciated in other photodiode array sampling devices, makes possible the elimination of this kTC noise.

Figure 4:
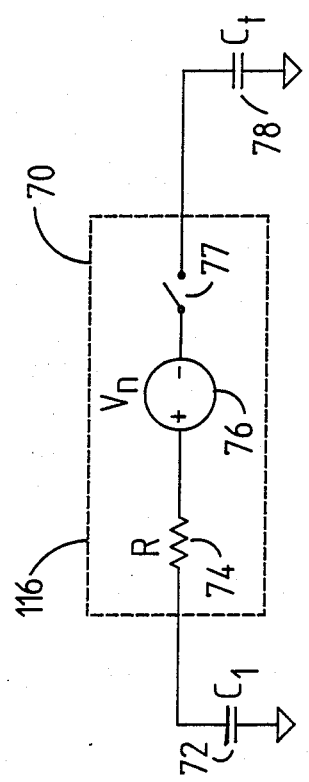
FIG. 4 shows a high frequency model of the circuit illustrated in FIG. 1 for one photodiode.

The operation of the transfer switch and associated noise charge distribution is illustrated in FIG. 4 which depicts a high frequency model of the transfer switch 116 ($Q_1$), the photodiode capacitor 72 ($C_1$) and the total amplifier capacitance 78 ($C_t$) which is the parallel capacitance of the feedback capacitor 122 ($C_f$) and the equivalent capacitor 124 ($C_a$). The transfer switch 116 ($Q_1$) of FIG. 4 is modeled as a noiseless resistor 74 (R), a resistor noise voltage source 76 ($V_n$), and an ideal switch 77. This model is only valid at frequencies above the unity gain point of the operational amplifier. At frequencies much greater than the unity gain point of the amplifier, the output of the amplifier remains at a constant voltage. In the preferred embodiment, the time constant of the charge amplifier is much greater than the $RC_s$ time constant composed of the product of the resistor 74 (R) and series capacitance $C_s$ of capacitors 72 ($C_1$) and 78 ($C_t$).

The following relationships are illustrated in this high frequency model:

Total Amplifier Capacitance = $C_t$ = Imput Amplifier Capacitance ($C_a$) + Feedback Capacitance ($C_f$)

-continued

Series Capacitance $C_s$ = Series Combination of $C_1$ & $C_t$
$$= \frac{C_1 * C_t}{C_1 + C_t}$$
$RC_s$ = noise time constant When the transfer switch 116 (shown in FIG. 3) is closed, i.e., ideal switch 77 (shown in FIG. 4) closed, the kTC noise charge is generated on capacitors 72 ($C_1$) and 78 ($C_t$) by the voltage 76 ($V_n$). This noise charge is the same on both capacitors (but opposite polarity), regardless of the value of capacitors $C_1$ and $C_t$. However, this kTC noise charge is not immediately seen at the output of the operational amplifier because the bandwidth of the amplifier is very low compared to the bandwidth of the noise.

When the transfer switch 116 ($Q_1$) is opened, the feedback capacitor 122 ($C_f$) receives an additional noise charge. The noise charge stored on capacitor 78 ($C_t$), or equivalently on the inverting input node 198 (see FIG. 3) is transferred completely to the feedback capacitor 122 ($C_f$) by the action of the operational amplifier 123, so that an additional voltage proportional to the noise charge appears at the output node 197. The same noise charge is present (with opposite polarity) on the capacitor 114. This noise charge on capacitor 114 remains until the transfer switch 116 ($Q_1$) is again closed. A reset switch 199, coupled across capacitor 122, is used for resetting the capacitor between measurements.

Figure 2:
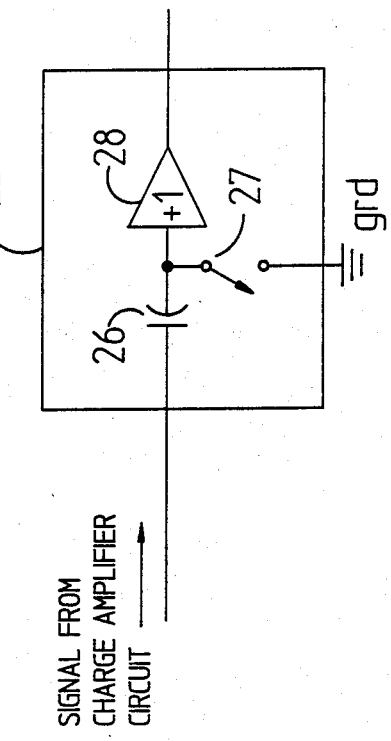
FIG. 2 illustrates one prior art circuit for reducing noise using analog subtraction.

Looking again at FIG. 3, the preferred embodiment of the invention employs an analog subtract circuit 88 to reduce thermal switching noise generated by the reset switch 199. This circuit operates in the same manner as the circuit in FIG. 2 (which is disclosed in the Background of the Invention). It should be noted that an analog subtract circuit is not required, and without it, the output of the charge amplifier could be coupled directly to an A/D converter 90. In the preferred embodiment, the A/D converter 90 is employed to convert the analog subtract circuit 88 output signal 91 to a digital form. The microprocessor 100 controls the FET transfer switches 116 and the reset switch 199 ($Q_f$) in order to perform kTC noise cancellation on the output signal. The following steps describe the operation of one photodiode 110 for one measurement cycle. It is understood that in actual operation, the same steps are performed on each of the photodiodes in the array in exactly the same way, so that a continuous cycling of measurements may be made. The preferred embodiment of the invention is illustrated in the following inventive steps:

1. Transfer switch 116 ($Q_1$) is opened from the previous reading, and an old kTC noise charge, defined as "First Noise", is stored on capacitor 114 ($C_1$).

2. Incident light 108 (striking photodiode 110) causes a signal charge defined as "First Signal", to accumulate on capacitor 114 ($C_1$), until the transfer switch 116 ($Q_1$) is re-closed (in step 3).

2.5 While the transfer switch 116 ($Q_1$) is still open, the reset switch 199 is momentarily closed, shorting out the feedback capacitor 122 ($C_f$).

3.0 Transfer switch 116 ($Q_1$) is closed, transferring First Signal and First Noise to the inverting input node 198.

3.1 First Signal and First Noise are transferred to capacitor 122 ($C_f$) by the action of the operational amplifier 123. This changes the voltage on the output node 197 to a value defined as "First Voltage", which is proportional to the sum of First Signal and First Noise. The action of the operational amplifier also returns the inverting input node 198 to the virtual ground.

3.2 First Voltage is now measured and recorded.

4.0 Transfer switch 116 ($Q_1$) is now opened. This step corresponds to step 1, but for the next measurement cycle. Another kTC noise charge defined as "Second Noise", which had been fluctuating, stops fluctuating and appears as a constant charge on capacitor 114 ($C_1$). At the same time, a charge having the same value, but of opposite polarity as Second Noise appears as a constant charge on the inverting input node 198.

4.1 After a short period Second Noise, by the action of the operational amplifier 123, appears as a change in the voltage at the output node 197. This output voltage is defined as "Second Voltage" and is proportional to the sum of First Signal, First Noise and the negative of Second Noise. By action of the operational amplifier 123, the voltage on the inverting input node 198 is now equal to virtual ground.

4.2 Second Voltage is now measured and recorded.

4.3 A Third Noise is derived as the combination of Second Voltage minus First Voltage.

5. While the transfer switch 116 ($Q_1$) is open (from steps 4 through 6) the incident light 108 causes a signal charge defined as "Second Signal" to accumulate on capacitor 114 ($C_1$).

5.5 While the transfer switch 116 ($Q_1$) is still open, the reset switch 199 is momentarily closed, shorting out the feedback capacitor 122 ($C_f$).

6. Transfer switch 116 ($Q_1$) is now closed transferring Second Signal and Second Noise to the inverting input node 198.

6.1 Second Signal and Second Noise are converted into a new voltage defined as "Third Voltage" at the output node 197, by the same process occurring in step 3.1.

6.2 Third Voltage is now measured and recorded.

7.0 The noise free image signal is now constructed by adding Third Noise and Third Voltage.

These steps may be better understood by referencing the transfer switch and the reset switch timing diagram of FIG. 5. These diagrams include reference numbers corresponding to the steps outlined above.

In the preferred embodiment of the invention, the sensitivity of a spectrometer is enhanced. However, the invention has many other applications where kTC noise reduction is required. For example, optical character recognition circuits, CCD imagers, image sensors and broadcast cameras. Changes and modification of the invention, as set forth in the specifically described embodiments, can be carried out without departing from the scope of the invention which is intended to be limited only by the scope of the appended claims.

I claim:

1. A method for reducing noise in the output of a light sensing circuit, said circuit comprising at least one photodiode having a photodiode capacitance related thereto, coupled to a low bandwidth charge amplifier through a transfer switch, wherein a series of noisy image signals, each comprising an image signal representing the intensity of light incident on said photodiode and an unwanted noise signal, are transferred to said charge amplifier by opening and closing said transfer switch, said method comprising the steps of:

measuring the charge amplifier output, a first time after closing said transfer switch and a second time after opening said transfer switch, said unwanted noise signal being displaced evenly, but of opposite polarity, on both sides of said open transfer switch, subtracting said first and second measurements, wherein the difference corresponds to said unwanted noise signal;

storing said difference;

resetting said charge amplifier to accept a new signal;

transferring the noisy image signal next in the series of noisy image signals, and which contains the displaced unwanted noise signal of opposite polarity, to said charge amplifier;

measuring the charge amplifier output;

adding said stored difference to said transferred noisy image signal to eliminate the unwanted noise signal.

2. A method for reducing noise in the output of a light sensing circuit, said circuit comprising at least one photodiode and photodiode capacitor pair coupled to a low bandwidth charge amplifier, having a capacitor feedback, through a transfer switch, wherein, a series of noisy image signals each comprising an image signal representing the intensity of light incident on said photodiode and an unwanted noise signal are transferred to said charge amplifier, said method comprising the steps of:

(1) storing, on said photodiode capacitor, a first image signal and a first noise signal;

(2). resetting said charge amplifier capacitor;

(3) transferring said first image signal and said first noise signal to said charge amplifier by closing said transfer switch;

(4) measuring, at said charge amplifier output while said transfer switch is closed, a first noisy image signal comprising the first image signal transferred to said charge amplifier and the first noise signal;

(5) opening said transfer switch, to begin storing a second image signal and a second noise signal on said photodiode capacitor and to establish on the charge amplifier a third noise signal of equal but of opposite polarity to the second noise signal, said third noise signal combining with said signals already present on the charge amplifier;

(6) measuring, while said transfer switch is open a second noisy image signal at said charge amplifier output, comprising the combination of the image signal transferred to the charge amplifier, the first noise signal and the third noise signal;

(7) subtracting said first noisy image signal from said second noisy image signal, the difference being the third noise signal;

(8) storing said third noise signal;

(9) resetting said charge amplifier capacitor;

(10) transferring said second image signal and said second noise signal to said charge amplifier by closing said transfer switch;

(11) measuring, at said charge amplifier output, said second image signal and said second noise signal;

(12) adding said stored third noise signal, said second image signal and second noise signal to produce the second image signal.

3. An apparatus for reducing noise in a light sensing circuit, said circuit comprising at least one photodiode and capacitor in combination, coupled to a charge amplifier through a transfer switch, wherein, at least a first and a second image signal, corresponding to the intensity of light incident on said photodiode, are first stored on said photodiode capacitor on a first side of said transfer switch, and then sequentially transferred to said charge amplifier, on a second side of said transfer switch, with unwanted noise signal charges each time said switch is closed, said charge amplifier generating output signals proportional to said transferred signals, said apparatus for reducing noise comprising;

- a low bandwidth amplifier which only responds to said noise signal charge when said transfer switch is open;
- a memory for storing output signals from said charge amplifier, said charge amplifier outputting signals in response to image and noise signals transferred from said combination of said photodiode and said capacitor;
- means for closing and opening said transfer switch to provide for the transferring, measuring and storing of said image and noise signals such that two readings of said photodiode may be made for each of said image signals, wherein, said noise may be reduced in said second image signal by isolating a first noise signal corresponding to said first transferred image signal and subtracting it from said second transferred image signal which contains a second noise signal, said noise signals canceling each other as, upon opening said transfer switch, they dispose themselves evenly, but of opposite polarity, on said first and second side of said transfer switch, thus combining with the corresponding first and second image signals which are temporarily stored on either side of said transfer switch.

4. The apparatus as claimed in claim 3, wherein said low bandwidth amplifier has a time constant which is much greater than the time constant of the series combination of the total amplifier capacitance and the photodiode capacitance.

5. The apparatus as claimed in claim 4, wherein said low bandwidth amplifier has a time constant of approximately 10 microseconds.

6. The apparatus as claimed in claim 3, wherein said low bandwidth amplifier has a time constant greater than five times the time constant of the series combination of the total amplifier capacitance, the photodiode capacitance and the transfer switch resistance.

7. The apparatus as claimed in claim 3 wherein said low bandwidth amplifier has a time constant less than one-fifth of the readout time for each photodiode in the photodiode array.

* * * * *